United States Patent [19]
Grivérus

[11] 3,978,727
[45] Sept. 7, 1976

[54] METHOD AND DEVICE FOR CORRECTING THE OUTPUT SIGNAL FROM A DIGITAL TRANSDUCER FOR MEASURING A PHYSICAL MAGNITUDE OR VARIABLE

[76] Inventor: Tor Lennart Bernt Grivérus, Nasbydalsvagen 6, 183 31 Taby, Sweden

[22] Filed: Nov. 11, 1974

[21] Appl. No.: 522,789

[30] Foreign Application Priority Data
Nov. 9, 1973   Sweden .............................. 7315252

[52] U.S. Cl. ........................... 73/194 E; 235/92 FL
[51] Int. Cl.² ......................................... G01F 1/05
[58] Field of Search ......................... 73/194 E, 229; 235/92 MT, 92 FL

[56] References Cited
UNITED STATES PATENTS

| | | | |
|---|---|---|---|
| 3,302,005 | 1/1967 | Farnsworth | 235/92 R |
| 3,605,497 | 9/1971 | Zimmerman et al. | 73/229 |
| 3,660,644 | 5/1972 | Hammond et al. | 235/92 FL |
| 3,705,295 | 12/1972 | Betz | 235/92 PL |
| 3,864,551 | 2/1975 | Oefinger | 235/92 PC |

*Primary Examiner*—Charles A. Ruehl
*Attorney, Agent, or Firm*—Woodhams, Blanchard and Flynn

[57] ABSTRACT

A method and circuit is provided for correcting an output signal pulse train received from a digital transducer representing a physical magnitude. The pulse frequency varies proportionally, although not directly proportionally, with said magnitude so that in a graph the relationship will be illustrated by a straight line which will not intersect the origin of the graph but pass on either side thereof. By superimposing (adding or subtracting) correction pulses on the transducer pulses, said line is displaced and caused to intersect the origin. In superimposition, primarily two conditions have to be fulfilled: no correction pulses are sent for superimposition unless a transducer pulse has occurred first, and the correction pulses and transducer pulses are maintained separated in time so as to be clearly distinguishable.

10 Claims, 10 Drawing Figures

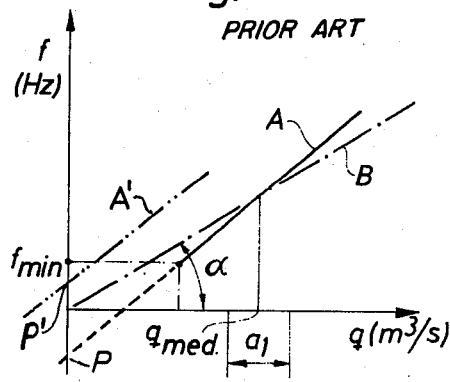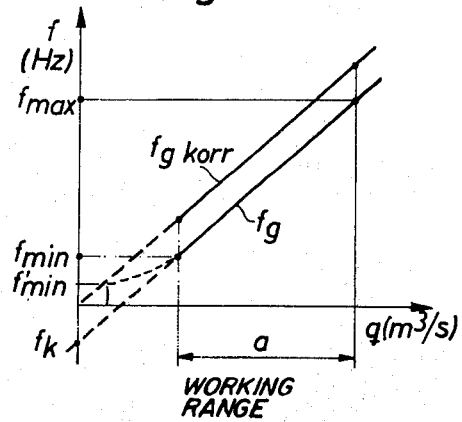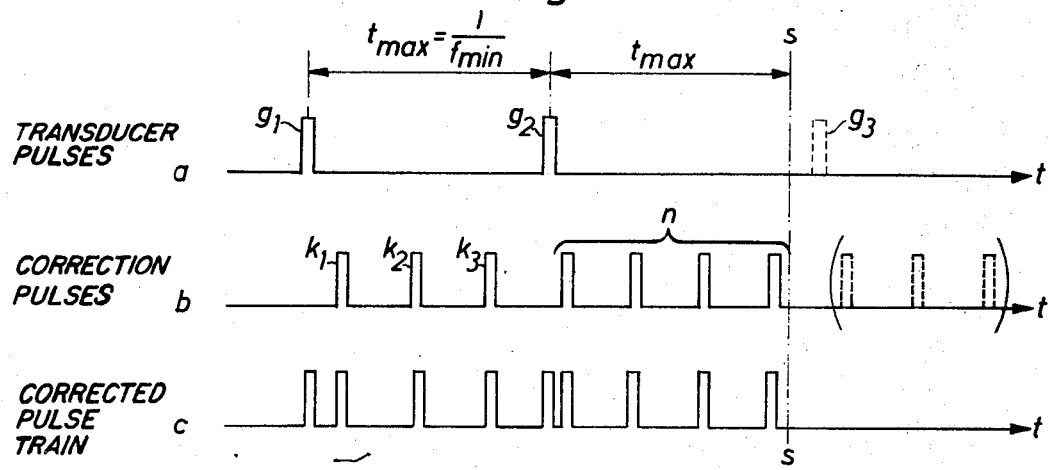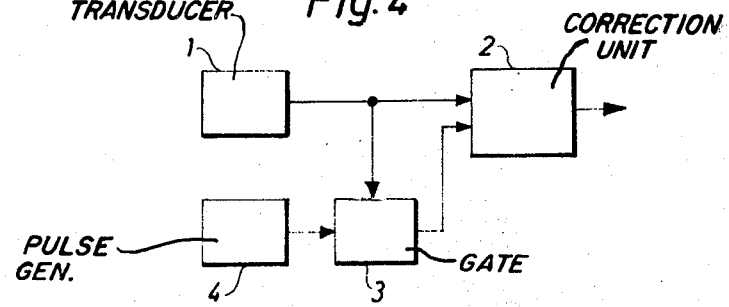

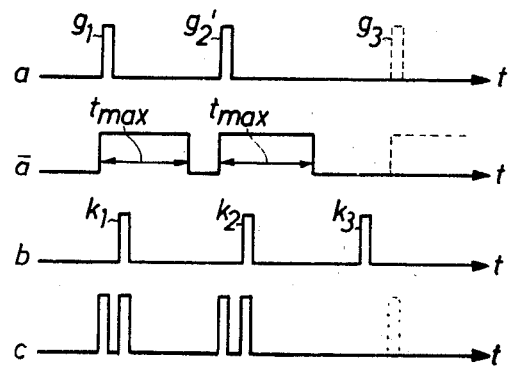
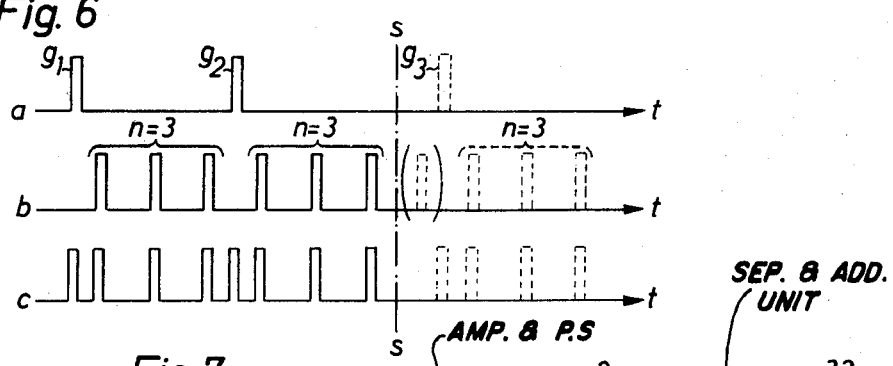
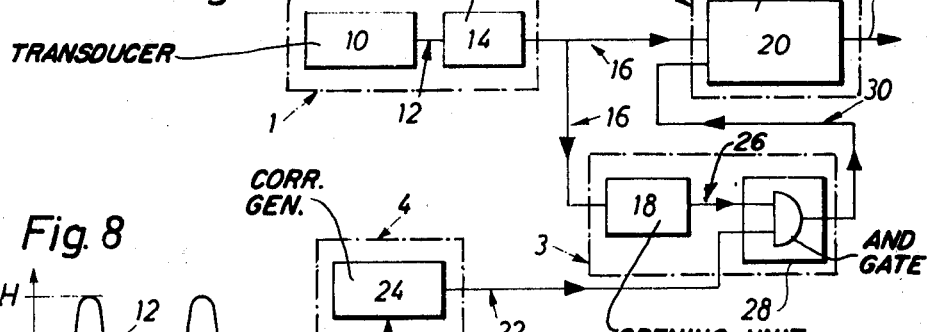
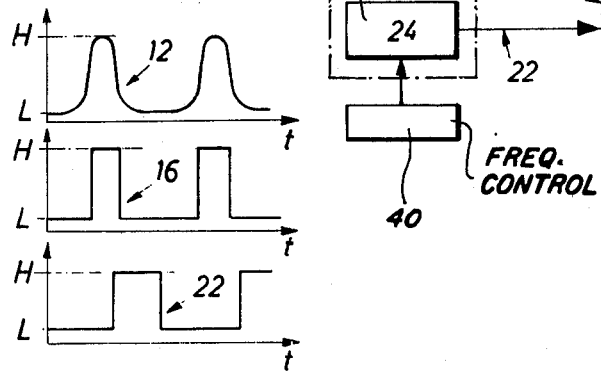

METHOD AND DEVICE FOR CORRECTING THE OUTPUT SIGNAL FROM A DIGITAL TRANSDUCER FOR MEASURING A PHYSICAL MAGNITUDE OR VARIABLE

The present invention relates to a method for correcting an output signal in the form of a pulse train from a digital transducer for measuring a physical magnitude or variable, and the invention also relates to a device for carrying out the method.

It occurs in many cases where there are accurately working measuring instruments, that these give output signals, between which and the measuring magnitude in question there exists an accurate linear relationship, which may be termed the "measuring characteristic" of the instrument (i.e. a curve showing signal versus magnitude) consisting of a straight line. Due to friction, other physical conditions, inherent qualities of the instrument etc. the output signals are, however, in reality not directly proportional to the measurement variable. In other words, the characteristic of the instrument or its extension will not cut through the origin of the coordinates required for plotting the characteristic, but will pass to one side of it. This causes an inconvenience, especially when the transducer signal has the form of a pulse train, where the pulses are counted and registered by adding means or counters, which operate with direct proportionality themselves.

The invention has the object of providing a correction for the pulse train sent by a transducer of this kind, so that the pulse train will be directly and accurately proportional to the measurement magnitude over the whole of the working range of the transducer. This object is achieved by providing the method according to the invention with the distinguishing features disclosed in claim 1.

The invention will now be described, by way of example, with reference to the attached drawings, in which:

FIG. 1 shows a typical example of a measurement characteristic, i.e. a graph, in this case a straight line, over the frequency of transducer pulses caused by a measurement magnitude, as a function of the true value of the measurement magnitude, the figure illustrating the conditions in known techniques.

FIG. 2 is a figure corresponding to FIG. 1 but shows how the correction of the measurement characteristic is carried out according to the invention.

FIG. 3 is a pulse diagram and shows the transducer pulses and the correction pulses are superimposed according to the invention.

FIG. 4 shows a simple block diagram of a correction circuit arranged for carrying out the method according to the invention.

FIGS. 5 and 6 are pulse diagrams illustrating the superimposition of transducer pulses and correction pulses according to two alternative working methods of the circuit according to FIG. 4.

FIG. 7 is a block diagram corresponding to FIG. 4 but showing the correction circuit in more detail.

FIG. 8 is a pulse diagram showing the pulse shape of the transducer and correction pulses.

Figure 9:
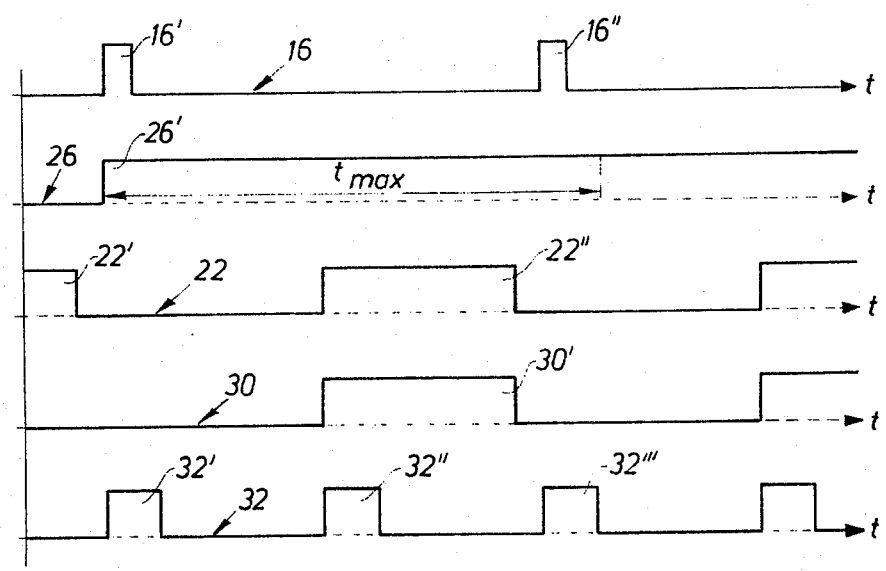
FIG. 9 is a further diagram, illustrating the superimposition of transducer and correction pulses, and, FIG. 10 is a detailed block diagram over a separation and addition circuit, which is part of the circuit of FIG. 7.

The problems connected with earlier techniques, indicated in the introduction will be illustrated briefly with reference to FIG. 1, which shows the characteristic for an instrument of the kind where the invention is intended to be applied, i.e. an instrument wherein the transducer sends a pulse train where the frequency of the pulses is linearly proportional to the measurement magnitude.

As an example, a flow-meter for measuring a volume flow $q$ $m^3/s$ is chosen, wherein the transducer or indicator has the shape of a rotor or a circulating (orbiting) ball, the revolutions of which (frequency) $f$ Hz are measured in a known and suitable way. The characteristic obtains the form of a straight line, and this is shown in FIG. 1 as a full line A, whereat it should be noted that the line starts from a lowest value $f_{min}$ corresponding to a lowest volume flow $q_{min}$, i.e. the latter value represents the lowest volume flow which is required for the instrument to start or which is measured practically. In other words, $q_{min}$ determines the lower limit of the working range. If the line is extended (note the dashed part of line A) it will as a result of various drag factors, primarily hydraulic losses, cut the axis of ordinates at one side of the origin, that is to say at point P below the origin.

It should be noted here that there are also cases when the rectilinear characteristic cuts the axis of ordinates above the origin, as indicated by the double dot-dashed line A' in FIG. 1, which line cuts the axis of ordinates at a point P' above the origin. Several physical transducers exhibiting this characteristic feature exist, and as far as flow-meters are concerned there are such of the hydrodynamic oscillation type, e.g. so called vortex shedding flow-meters, without moving parts and whose characteristics intersect the axis of ordinates at points above the origin. However, as far as the invention is concerned it is insignificant whether the intersecting point lies above or below the origin, as will be clearly understood from the following.

For the reproduction of f is conventionally used an integrating or direct indicating device, e.g. an adder for summing the pulses sent, the pulses stepping up the adder in a known way. Since the line A is straight, the transmitted frequency f will be proportional to the volume flow q, but since the line does not cut the origin, the frequency will not be directly proportional to q. The counter or adder, on the other hand, will register in direct proportion to received signals, its own characteristic thus starting from zero. To compensate this proportionality deviation, the adder is normally adapted so that its characteristic, note the dot-dashed line B in FIG. 1, is given such a slope $\alpha$, i.e. the adder is given a proportionality factor $K = \tan \alpha$, that it intersects the transducer characteristic A at approximately the middle, $q_{med}$, of the desired working range. Measurement errors are obviously obtained thereby, these errors increasing towards the boundaries of the working range, and since in most cases only moderate errors can be accepted, the working range will be reduced to a very small area $q_{med}$, as is noted by $a_1$ in FIG. 1, this being something which naturally means great inconvenience in practice.

The invention intends instead to achieve a complete correction of the transducer signals, which means that they will not only be proportional but even directly proportional to the measurement magnitude, without the meter loosing any of its measurement accuracy. In other words, the extension of the characteristic will cut the origin. The correction is obtained by the manner, simple in principle, of superimposing the transducer frequency with a definite but adjustable correction frequency, whereby the characteristic will be displaced upwardly, and is hereby so adjusted that the extension of the characteristic cuts the origin. This is illustrated in FIG. 2 where the uncorrected frequency of the transducer is denoted by a line $f_u$ (corresponding to the line A in FIG. 1) while the corrected frequency is shown by a line $f_{u\ korr}$. The constant frequency which is added to the transducer frequency is denoted by $f_k$, and thus is obtained:

$$f_{u\ korr} = f_u + f_k$$

Within the working range, which extends from a lowest value $f_{min}$ to a desired upper boundary $f_{max}$, and which is denoted by $a$ in FIG. 2, the corrected transducer frequency $f_{u\ korr}$ will thus be directly proportional to q, over the whole range.

In the light of the above it should be obvious why it makes no difference in principle whether the uncorrected characteristic cuts the axis of ordinates below or above the origin (lines A and A', respectively, in FIG. 1). In the last mentioned case the necessary correction frequency has only to be subtracted from instead of added to the uncorrected frequency of the transducer. The term "superimposition" and its derivatives are thus used in the specification and claims in their general mathematical sense, meaning that the magnitudes under consideration are combined with their proper signs.

To achieve the desired parallel displacement of the transducer characteristic the procedure adopted according to the invention is such that a pulse generator is arranged which sends pulses with the desired correction frequency $f_k$, and which is connected to the transducer output. Certain definite conditions apply for the connection, and these must be met for frequency superimposition with the desired parallel displacement of the transducer characteristic to take place without error. There are chiefly three conditions. Firstly, correction pulses must not be sent if transducer pulses do not occur, and this condition can be formulated so that correction pulses may only be sent after a transducer pulse has been sent. Secondly, a transducer pulse and a correction pulse must not coincide, since the adder will then only register 1 pulse, while correct superimposition requires 2 pulses to be registered; registering and correction pulses which completely or partly coincide must therefore be separated so that the adder can distinguish two pulses. Thirdly, correction pulses must not continue to be sent after the instrument transducer or indicator has stopped, or, if the transducer were to carry on below $f_{min}$, i.e. outside the lower boundary of the working range, the correcting pulses consequent on each transducer pulse would have to be limited to a maximum amount.

The conditions will be discussed more closely with reference to FIG. 3, which illustrates the occurring transducer and correction pulses, dotted along a time axis, the transducer pulses being shown at $a$, the correction pulses at $b$ and the collected or superimposed pulses at $c$. The Figure illustrates the case where the transducer frequency moves towards its lowest value, whereat $g_1$ denotes a penultimate pulse, while $g_2$ denotes a terminal pulse sent with the frequency $f_{min}$. By $g_3$ is denoted a possibly occurring late pulse outside the working range. The correction pulses $k_1$, $k_2$ etc. are sent with a regular time interval according to the basic assumptions. According to the last of the above-mentioned conditions, the correction pulse train must be broken after the last transducer pulse $g_2$, whereat the break must not take place simultaneously with $g_2$, but first after a definite number n of correction pulses has been sent corresponding to the time interval between the penultimate pulse $g_1$ and $g_2$. If the lowest transducer frequency is $f_{min}$, the maximum time interval between transducer pulses will thus be $t_{max}$, i.e. just at the boundary of the working range, $= 1/f_{min}$. If the correction frequency is $f_k$, the number n of correction pulses during this time will thus be $= t_{max} \cdot f_k = f_k/f_{min}$. As denoted by the vertical dotted line S in FIG. 3, the sending of correction pulses is broken off after $n$ such pulses have been sent after the last transducer pulse $g_2$. At $c$ in FIG. 3, the appearance of the corrected pulse train is thus shown just before the moment when the transducer stops.

In this connection it is pointed out that by $f_{min}$ is generally intended the lowest point in the rectilinear portion of the transducer characteristic. As has already been indicated, in reality the transducer pulses will in certain cases be sent with a lower frequency than $f_{min}$, but then in a non-linear area outside the working range. Especially with the flow meters given as examples, the medium can have such a high viscosity that when the flow is diminishing the transducer or indicator will send pulses deviating from the linear characteristic to finally stop at a value $f_{min}$, as indicated in FIG. 2. When the invention is put into practice, however, $f_{min}$ is always reckoned as being at the end of the rectilinear portion of the characteristic. It is further pointed out that in principle nothing is altered if frequency multiplication is used, i.e. if the output signal of the transducer is exposed to frequency multiplication, e.g. $u$ times. $f_k$ is hereby multiplied u times as well, and the ratio $f_k/f_{min} = n$ will be unaltered.

In FIG. 4 a general block diagram is shown over an electronic circuit with the help of which the method according to the invention can be carried into effect. A transducer as above is denoted by the numeral 1, and is arranged to emit a pulse train with a frequency proportional to the measurement magnitude, e.g. the volume flow of a flow meter. The output of the transducer is connected to the input of a correction unit 2 and to a control input of a gate circuit 3, the output of which is connected to a second input of the correction unit 2. A pulse generator 4 for generating correction pulses is connected to a second control input of the gate circuit 3. For the sake of simplicity, the four components are considered as separate unit, while in practice they can be built together in different ways, possibly all four being in a single integrated circuit.

In agreement with the preceding, the circuit works so that the transducer pulses from the transducer 1 and the correction pulses from the generator 4 are superimposed in the correction unit 2 for further transmission to a counter or adder (not shown). As has been mentioned above, a simple superimposition of the pulses cannot take place however, and the correction unit 2 in combination with the gate 3 supervises that the above-mentioned conditions for superimposition are met.

With regard first of all to the "separation condition", which says that two pulses from the transducer 1 and the pulse generator 4 occurring simultaneously must not be fed out as a single pulse, but must be separated, this condition is filled by the correction unit containing a memory where coincidental pulses are stored for successive output. If thus the output of one pulse is in process when another pulse is fed into the correction unit, the new pulse is queued in the memory. Transmitting the new pulse is first begun after a certain time has passed since the termination of the preceding pulse, for the purpose of providing sufficient separation between two sequential pulses so that the adder used will safely note two pulses.

Meeting both the remaining conditions is supervised by the gate circuit 3, i.e. the coordination between both the pulse trains, signifying on the one hand that the correction pulses may not be transmitted "on their own" but are continuously transmitted in response to transducer pulses occurring first, and on the other hand that the correction pulses are limited when the "scarcity" between the transducer pulses has become so great that the lower boundary of the measuring range has been fallen short of. Hereby, the condition concerning the sovereignty of the transducer pulses is simply filled by the gate, which blocks or passes the correction pulses, only opening on triggering by a transducer pulse. To meet the remaining condition, the gate must obviously be so constructed that it breaks the correction pulse train if a transducer pulse is not present, i.e. if $g_2$ according to FIG. 3 is not followed by a pulse $g_3$, but should one or more such late pulses occur, only a predetermined maximum number of correction pulses is passed through for each such transducer pulse. The gate can hereby be arranged in two principly different ways, viz. its function is either based on measurement of the time or on counting pulses.

A time control or "timing" gate 3 functions so that each transducer pulse triggers the gate for keeping it open a certain maximum time $t_{max}$, which according to the preceding is equal to the inverted value of $f_{min}$, with transducer frequences exceeding $f_{min}$, the gate will thus be open continuously.

This situation is illustrated in FIG. 5, where the transducer output signal is shown at $a$, and at $\bar{a}$ the gate function, i.e. this line shows those time intervals $t_{max}$ for which the gate is open. The correction pulses are shown at $b$, and at $c$ the resulting output signal from the correction unit. As may be seen, the pulse $g_1$ triggers the gate open, and this will thereby let through a subsequent correction pulse $k_1$. The next transducer pulse $g'_2$ is assumed to come somewhat too late due to the transducer having stopped for a moment, so that the gate has had time to close, but $g'_2$ opens it again so that the subsequent correction pulse $k_2$ is passed. The correction pulse $k_3$ subsequent thereon is not passed since the gate has once again had time to close, and pulse $g_3$ is assumed to be excluded.

In FIG. 6 the conditions are illustrated when the gate is designed so that it functions by counting, which means that it consistently passes through at most a certain number of correction pulses n determined by $n = f_k/f_{min}$, it being assumed in this case that $n = 3$. As before, the transducer pulses are indicated at $a$, the correction pulses at $b$ and the superimposed pulses at $c$. The transducer pulse $g_2$ triggers the gate open and three correction pulses are passed through, thereafter input is blocked as indicated by the line S, since no further transducer pulses occur. Should a late pulse $g_3$ occur through, it triggers by itself three correction pulses, and this situation is illustrated by dotted lines to the right of the line S. In this connection it is pointed out, however, that both in FIG. 3 and FIG. 6 the correction frequency has been shown several times larger than the transducer frequency for the sake of clarity. In reality both frequencies are of the same order of magnitude, i.e. $n \approx 1$; sometimes $f_k$ is even smaller than $f_u$.

The last mentioned method means a certain approximation, since the given number of pulses passed by the gate shall correspond to the number which was previously defined as $n = f_k/f_{min}$, and this quotient must thus be rounded off to the nearest positive integer. Without any great difficulty the gate can, however, be modified so that the average value of the number of pulses passed through attains the desired value $n$. For this purpose the gate is supplemented by a memory which causes it to pass a number of pulses which is sometimes rather greater and sometimes rather less than $n$, so that the average value of several throughputs converges towards $n$.

A simple numerical example illustrates the principle. Assume that the quotient $f_k/f_{min}$, i.e. the desired number of correction pulses $n$ is 2.6, which is the same as (13/5 or 2 3/5). The gate shall then be arranged so that three correction pulses are put through 3 times out of 5, while the remaining two times only two pulses are put through. The average value over a long series of transducer pulses will then obviously be 2.6.

A practical embodiment example of a circuit according to FIG. 4 will be accounted for while referring to FIGS. 7-10, FIG. 7 reproducing this circuit somewhat more developed with the components 1-4 indicated in FIG. 7 by dotted blocks. A transducer 10 emits an analogue signal 12, the magnitude of which is determined by the sensing or transducing element of the transducer. The signal 12 is converted to a signal formed as a pulse by a combined amplifier and pulse shaper 14. A correction generator 24 generates a correction frequency 22 which according to the preceding is so adjusted that the correction pulses, on superimposition on the transducer pulses, cause the desired displacement of the transducer characteristic as described in the aforegoing. In FIG. 8 an example is shown of the appearance of the different pulses, whereat uppermost in the Figure is shown the signal 12 which is converted in the pulse shaper 14 to a square signal 16, while the pulse generator 24 sends a square-shaped correction signal 22. A pulse may be regarded as a series of potential jumps, i.e. the signal alternates between a "low" and a "high" level, as indicated by H and L respectively in FIG. 8, the duration of the pulse or the pulse time being the time the signal remains at the high level.

The previously mentioned gate circuit 3 includes according to FIG. 7 an opening unit 18 together with an AND-gate 28, this combination attending to the two conditions concerning the sovereignty of the transducer pulses, i.e. that correction pulses may only be passed on the condition that a transducer pulse has occurred first, and furthermore the correction pulses must be stopped or limited if the transducer pulses stop or are emitted with a frequency falling below $f_{min}$, i.e. if the transducer leaves its working range (where its characteristic is rectilinear). The transducer pulses 16 which are sent from the amplifier/pulse-shaper 14 are fed to the previously mentioned correction unit 2, which contains a separation and addition unit 20, more closely shown and described in connection with FIG. 10. Each pulse also triggers the opening unit 18 to give a signal of a definite maximum duration corresponding to the previously defined time $t_{max}$. If the time interval between the transducer pulses is shorter than $t_{max}$, the opening unit emits a continuous signal, i.e. its output is at a "high " level. This is illustrated in FIG. 9 which graphically illustrates different signals from the circuit according to FIG. 7, the time scale being somewhat extended for the sake of clarity. It is first assumed that transducer pulses do not occur, the signal 26 therefore being at the "low" level (zero level). When a transducer pulse 16' occurs it triggers the opening unit to raise its signal level to high and this high level 26' is maintained for the signal 26 by the subsequent transducer pulse 16''. If the pulse 16'' had not occurred, the signal 26 would have fallen to zero after the time $t_{max}$ as indicated by a dotted line in the figure. The signal 26 is applied to the AND-gate 28 which also receives the correction pulses 22. For these to be passed through the gate, both the inputs to it must be at a high level, according to the working conditions for this kind of gate. At the output of the gate 28, only pulses 30 corresponding to the pulses 22 fed by the correction generator 24 occur as long as the signal level 26' is high. The result of the superimpositions may also be seen from FIG. 9. An occurring correction pulse 22' can not get through the AND-gate 28 since the signal 28 is low when 22' comes. The following correction pulse 22'' comes through on the other hand and appears as a pulse 30' which further passes through the separation and addition unit 20. This unit freely lets through the transducer pulses 16 and the correction pulses 30 as long as these pulses are well separated in time. If they coincide or if they are too close, separation in the unit 20 takes place, see below. A resulting output signal 32 thus obtains the appearance as shown lowest down in FIG. 9, i.e. a pulse train 32 comprising a first pulse 32' corresponding to the transducer pulse 16', a second resulting pulse 32'' corresponding to the correction pulse 30', a third resulting pulse 32''' corresponding to the transducer pulse 16'' and so on.

Figure 10:
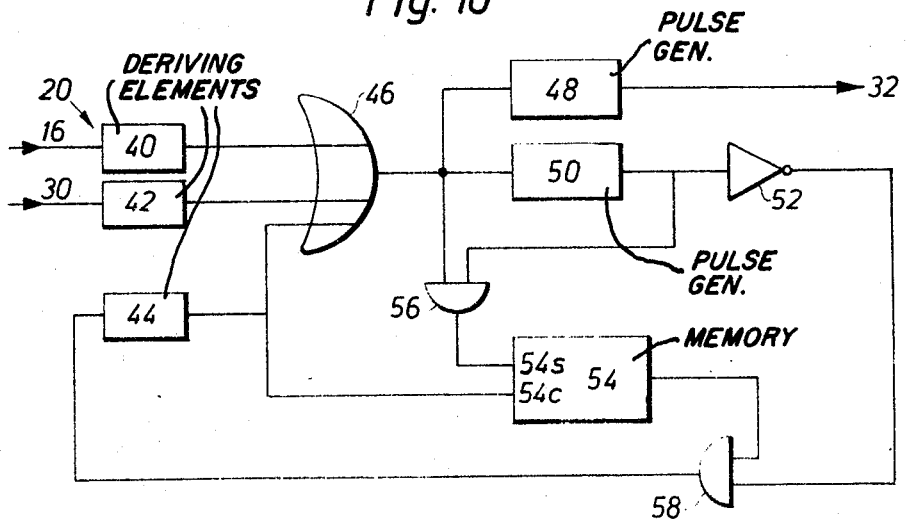

The separation and addition unit 20, see FIG. 10, comprises three deriving elements 40, 42 and 44, an OR-gate 46, two pulses generators 48 and 50 and an inverting element 52, a memory element 54 and two AND-gates 56 and 58. The unit 20 is supplied with transducer and correction pulses 16 and 30 respectively and emits resulting pulses 32. The unit is constructed so that it reacts to the front flank of the incoming pulses, i.e. for the potential jump from low to high. An incoming pulse, i.e. 16 or 30, is derived by the elements 40 and 42 respectively which for each received pulse emits a very short pulse (peak pulse) which thus coincides in time with the front flank of the incoming pulse. This short pulse passes the OR-gate 46 and starts both the pulse generators 48 and 50, which each emit a pulse, the pulse time $\tau_2$ of 50 being somewhat longer than the pulse time $\tau_1$ of 48. As the generators have been triggered their output signals will be high, and if a pulse were now to come in while transmission by the generator 48 is taking place, this new too prematurely arrived pulse would be switched to the memory element 54 via the AND-gate 56, which it can pass since both inputs of the gate will be high (the output from 50 is of course high at the moment). The memory element which receives the pulse through its storing input 54s controls via its output the further AND-gate 58, and in the moment considered the input from 54 for this gate is high. When now the pulse time $\tau_2$ has passed, i.e. the signal from the pulse generation 50 falls from high to low level, this jump is switched over the inverting element 52, which thus moves the level from low to high, to the OR-gate 46, whereby the AND-gate 58 can be passed since both its inputs are high. The signal arrives at the gate 46 via the deriving element 44, for convertion to a very short pulse or peak pulse, of the same shape as the pulses from the deriving elements 40 and 42. This pulse, which resets the memory element 54 through the resetting input 54c of the latter, can now pass freely to the output 32, well separated from the adjacent or closely preceding pulse thanks to its being delayed through the described feed back or recirculating to the memory 54. It will be seen that the reason why the pulse time $\tau_2$ should be somewhat longer than $\tau_1$ is to ensure that a pulse arriving at the generators 48 and 50 will not be "killed," because if 50 be inactive but 48 in operation (i.e. $\tau_2 \leq \tau_1$) when the pulse arrives, generator 50 is triggered without affect on the output 32 and without the pulse being stored in the memory 54.

In the circuit described above the opening unit 18 works, as is apparent, so that in response to transducer pulses it determines the throughput of the correction pulses 30 to the separation and addition unit 20 in response to the time $t_{max}$. As has been pointed out, however, it is also possible to determine the greatest number of allowed correction pulses after each transducer pulse, the opening unit 18 thus being modified in accordance herewith.

In the arrangement disclosed it is thus assumed that the superimposition correction frequency/transducer frequency means that the two frequences are added. As pointed out in the introduction there are also cases when the correction frequency is to be subtracted instead from the transducer frequency. This case of subtraction represents a technically simpler case than the case of addition, and the circuit according to FIG. 7 can readily be designed for carrying out this subtraction. For example, a conventional preset counter may be introduced as a kind of "transducer pulse eliminator" in such a way that it is continuously set by correction pulses to a selected number $n$ (e.g. 1, 2 or 3), upon which the desired number of transducer pulses may be successively eliminated by having to "count down" the preset counter before subsequent pulses are allowed to pass on to output. The necessary separation of the correction and transducer pulses may be brought about, for instance, in the same manner, in principle, as in the arrangement according to FIG. 10 while using pulse generators having somewhat different pulse times.

A great advantage with the arrangement according to the invention is that the correction pulse generating circuit can easily be modified to alter the frequency of the correction pulse (as by a suitable frequency control means as indicated diagrammatically at 40 in FIG. 7) to compensate varying outer conditions which affect the measuring values. In flowmeters for example, varying temperature can cause variation in the viscosity of the medium flowing through, and measuring errors caused thereby can thus be corrected by the temperature being made to control the frequency of the correction pulses. Furthermore, the frequency can be modified with regard to manufacturing deviations between different examples of the same transducer type, for the purpose of perfecting the accuracy of each individual instrument.

I claim:

1. A method for correcting an output signal from a digital transducer for measuring a physical magnitude, wherein said output signal is a pulse train of frequency $f_g$, the transducer frequency $f_g$ being essentially a straight line function of said physical magnitude within the working range of said transducer, said transducer having the inherent quality that in a graphical portrayal of said function including axes representing the transducer frequency and said physical magnitude an extension of said straight line beyond said working range cuts said transducer frequency axis at a point to one side of the zero point of such axis, said method including the step of superimposing a correction pulse frequency of $f_k$ on said transducer pulse frequency $f_g$ to thereby obtain a corrected transducer pulse frequency $f_{g\ korr}$, wherein said corrected transducer pulse frequency $f_{g\ korr}$ is also graphically portrayable as a straight line function of said physical magnitude, said method including the further step of adjusting said correction frequency $f_k$ such that said straight line representation of said corrected transducer pulse frequency $f_{g\ korr}$ cuts substantially through said zero point, the method further comprising:

a. providing correction pulses for superimposition on said transducer pulse train only after occurrence of a said transducer pulse;

b. providing, but limiting to a maximum number, a quantity of superimposed correction pulses per transducer pulse, when the transducer frequency $f_g$ is below its lowest operating frequency; and c. wherein the step of superimposing the frequencies $f_g$ and $f_k$ includes superimposing the trains of correction and transducer pulses and separating into two clearly distinguishable resulting pulses any transducer pulse and correction pulse which lie close together or substantially coincide to produce said frequency $f_{g\ korr}$.

2. The method of claim 1, in which said step (b) includes, after each transducer pulse, providing correction pulses for superimposition only during a period of time not exceeding the time between consecutive transducer pulses at said lowest operating frequency, said step (c) including first superimposing two trains of peak pulses derived from said correction pulses and transducer pulses to form a combination peak pulse train, and then producing longer output pulses from the peak pulses in said train except for a premature peak pulse too closely following a preceding peak pulse in said combined train, and later reapplying said premature peak pulse to said combined train.

3. The method of claim 1, in which said step (b) includes, after each transducer pulse, emitting correction pulses for superimposition wherein the number n of such emitted correction pulses is not greater than the quotient of said correction frequency $f_k$ and said lowest operating transducer pulse frequency.

4. The method of claim 1, in which said step (b) includes, after each transducer pulse, emitting for superimposition a quantity of correction pulses alternatingly equal to whole numbers N and K, N being the whole number immediately exceeding a number n and K being the whole number falling immediately below said number n, such step including using each transducer pulse to trigger a said alternate emission of N and K correction pulses, such that over a number of transducer pulses the average number of correction pulses per transducer pulse approaches n, where n is a number not greater than the quotient of said correction frequency and said lowest operating transducer frequency.

5. A device for correcting an output signal formed as a pulse train and which includes a digital transducer for measuring a physical magnitude and producing a pulse frequency $f_g$ indicative of the measured physical magnitude, the transducer pulse frequency $f_g$ being essentially a straight line function of said physical magnitude within the working range of said transducer, said transducer having the inherent quality that an extension of said straight line outside said working range cuts the transducer frequency axis at a place to one side of the transducer frequency zero point, said device further comprising:

a correction pulse generator for generating pulses at a correction frequency $f_k$;

a gate circuit means responsive to a said transducer pulse for then controllably feeding correction pulses, while limiting the number of correction pulses fed per transducer pulse when the transducer frequency $f_g$ is below its normal operating value;

a correction unit means connected also to receive said transducer pulses and those correction pulses fed from said gate circuit means for separating transducer and gated pulses overlapping or adjacent in time and producing a corrected pulse train including the nonadjacent transducer and correction pulses and separated pulses to obtain a corrected transducer pulse frequency $f_{g\ korr}$, the correction frequency $f_k$ being of value such that the resulting $f_{g\ korr}$ characteristic cuts essentially through said zero point;

means responsive to an extrinsic variable and connected to said correction pulse generator for varying said correction frequency $f_k$ to compensate for varying extrinsic conditions affecting the physical magnitude measured.

6. A device for correcting an output signal formed as a pulse train and which includes a digital transducer for measuring a physical magnitude and producing a pulse frequency $f_g$ indicative of the measured physical magnitude, the transducer pulse frequency $f_g$ being essentially a straight line function of said physical magnitude within the working range of said transducer, said transducer having the inherent quality that an extension of said straight line outside said working range cuts the transducer frequency axis at a place to one side of the transducer frequency zero point, said device further comprising:

a correction pulse generator for generating pulses at a correction frequency $f_k$;

a gate circuit means responsive to a said transducer pulse for then controllably feeding correction pulses, while limiting the number of correction pulses fed per transducer pulse when the transducer frequency $f_g$ is below its normal operating value;

a correction unit means connected also to receive said transducer pulses and those correction pulses fed from said gate circuit means for separating transducer and gated pulses overlapping or adjacent in time and producing a corrected pulse train including the nonadjacent transducer and correction pulses and separated pulses to obtain a corrected transducer pulse frequency $f_{g\ korr}$, the correction frequency $f_k$ being of value such that the resulting $f_{g\ korr}$ characteristic cuts essentially through said zero point;

said correction unit means comprising a combined separation and addition unit, said separation and addition unit including OR-gate means having inputs coupled respectively to said transducer and gate circuit means for receiving and transmitting said transducer pulses and correction pulses, first and second pulse generator means both triggered by said transmitted pulses for respectively producing corresponding first and second time duration pulses, a circuit output receiving said first time duration pulses from said first pulse generating means for each pulse which the latter receives when in an inactive state, said second pulse generating means having a first output circuit comprising an inverting means and a first AND-gate serially connecting same to a further input of said OR-gate means, said second pulse generator means having a further output path to the enabling input of a second AND-gate, a memory means having a storage input, said second AND-gate having a further input connected to the output of said OR-gate and an output connected to said memory means storage input for storing in said memory means a further pulse from said OR-gate means while said second pulse generator means is in an activated state, said memory means having an output connected to a further input of said first AND-gate, said inverting means being responsive to deactivation of said second pulse generator means at the end of a said time duration pulse produced thereby for causing said first AND-gate to transfer a said stored pulse from said memory means through said OR-gate means to reactivate said first and second pulse generating means to each time a further respective time duration pulse whereby said stored pulse results in a corrected pulse at said circuit output and which is well separated from the immediately preceding pulse, the output of said first AND-gate also being connected to a reset input of said memory means to reset said memory means for a further operation due to subsequent reception by said OR-gate means of a transducer pulse and correction pulse which overlap or substantially overlap in time.

7. A device as claimed in claim 6, in which said second pulse generator means has a pulse output duration exceeding that of said first pulse generator means, such that said second pulse generating means cannot be reactivated before said first pulse generating means.

8. A device as claimed in claim 7 including respective deriving means at the inputs of said OR-gate means for converting signals supplied to said OR-gate means into peak pulses.

9. A device for correcting the pulse train output of a digital transducer capable of measuring a physical magnitude, said transducer pulse train having a pulse frequency $f_a$ indicative of the measured physical magnitude, said transducer pulse frequency $f_a$ being substantially an indirect linear function of said physical magnitude within the working range of said transducer, wherein a graphical extension of said straight line function outside said working range cuts the transistor frequency axis at a nonzero value of the transistor frequency, said device further comprising:

a correction pulse generator for generating a train of correction pulses at a correction frequency $f_k$;

a gate circuit means enabled by a said transducer pulse to then pass no more than a maximum quantity of correction pulses even should no subsequent transducer pulses occur;

first and second pulse generating means having a common input point and activatable for respective first and second time periods, the period of activation of said second pulse generator means exceeding that of said first pulse generating means;

activating means connected to said common point and responsive to said transducer and gate circuit means for simultaneously activating said first and second pulse generating means upon occurrence of the first pulse of a train of superimposed transducer and gated correction pulses;

storing means responsive to the activated output state of said second pulse generating means and to occurrence of a second pulse of the superimposed pulse train, while said second pulse generator means is yet active, for storing a pulse;

applying means responsive to the end of the period of activation of said second pulse generating means for applying a said stored pulse to said common point and again activating said first and second pulse generating means and also for resetting said storing means, said first and second pulse generating means being nonresponsive to a pulse applied to said common point when in their activated states, but becoming responsive to such a pulse upon deactivation at the end of their respective first and second time periods;

output means responsive to successive periods of activation of said first pulse generating means for providing a corresponding train of output pulses representing said superimposed train of transducer and gated correction pulses but with overlapping or substantially overlapping pulses separated, whereby to produce an output pulse frequency directly linearly related to said measured physical magnitude.

10. A device a claimed in claim 9, in which said activating means include a plurality of peak pulse producing units each responsive to the initial transition of a corresponding one of said transducer pulses, gated correction pulses and stored pulses for producing peak pulses corresponding thereto, and a common OR-gate interposed between the outputs of said peak pulse producing units and said common point for supplying a succession of said peak pulses to said common point at the initiation times of said transducer, gated correction, and stored pulses, said storing means comprising an AND-gate having inputs connected to the input and output of said second pulse generating means and a memory unit having set and reset inputs respectively connected to the output of said AND-gate and the output of that peak pulse producing unit which receives stored pulses, said applying means including a further AND-gate having inputs respectively connected to the output of said memory means and through an inverter to the output of said second pulse generating means, said further AND-gate having an output connected to the input of that peak pulse producing unit responsive to stored pulses.

* * * * *